(12) United States Patent
Jia et al.

(10) Patent No.: US 10,500,607 B2
(45) Date of Patent: Dec. 10, 2019

(54) DEVELOPING DEVICE AND DEVELOPING METHOD

(71) Applicant: Wuhan China Star Optoelectronics Technology Co., Ltd., Wuhan, Hubei (CN)

(72) Inventors: Dongpo Jia, Guangdong (CN); Fan Wei, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/749,204

(22) PCT Filed: Nov. 25, 2017

(86) PCT No.: PCT/CN2017/112978
§ 371 (c)(1),
(2) Date: Jan. 31, 2018

(87) PCT Pub. No.: WO2019/056562
PCT Pub. Date: Mar. 28, 2019

(65) Prior Publication Data
US 2019/0091719 A1 Mar. 28, 2019

(51) Int. Cl.
*B05C 11/10* (2006.01)
*B05C 5/02* (2006.01)
(Continued)

(52) U.S. Cl.
CPC ........ *B05C 11/1005* (2013.01); *B05C 5/0295* (2013.01); *B05C 11/1026* (2013.01);
(Continued)

(58) Field of Classification Search
None
See application file for complete search history.

(56) References Cited

U.S. PATENT DOCUMENTS

| 4,959,122 A * | 9/1990 | Kurematsu | B01D 1/0082 |
| | | | 159/42 |
| 6,120,195 A * | 9/2000 | Nakano | G03D 3/065 |
| | | | 396/626 |
| 2003/0143491 A1 | 7/2003 | Lu et al. | |

FOREIGN PATENT DOCUMENTS

| CN | 1327888 A | 12/2001 |
| CN | 1760765 A | 4/2006 |

(Continued)

*Primary Examiner* — Jethro M. Pence
(74) *Attorney, Agent, or Firm* — Andrew C. Cheng

(57) ABSTRACT

Disclosed is a developing device for developing a substrate, comprising: a developing tank, a recovery box and a conveying unit provided right above the developing tank and configured to convey the substrate; wherein the developing tank comprises a first tank, a second tank and a third tank, which are spaced and are sequentially arranged; the recovery box comprises a first box and a second box; the first tank is communicated with the first box; as the substrate is arranged in the second tank, the second tank is communicated with the first box; as the substrate is arranged in the third tank, the third tank is communicated with the second box. The developing device can solve the technical problems of separately recovering the developers doped with different photoresist concentrations during the development of the substrate to reduce the cost of diluting the developer concentration in the recovery box.

10 Claims, 3 Drawing Sheets

(51) Int. Cl.
  *B05D 1/02* (2006.01)
  *B05D 1/32* (2006.01)
  *G03F 7/30* (2006.01)
  *H01L 51/00* (2006.01)

(52) U.S. Cl.
  CPC .............. *B05D 1/02* (2013.01); *B05D 1/32* (2013.01); *G03F 7/3028* (2013.01); *G03F 7/3042* (2013.01); *G03F 7/3092* (2013.01); *H01L 51/0017* (2013.01)

(56) References Cited

FOREIGN PATENT DOCUMENTS

| | | |
|---|---|---|
| CN | 203837242 U | 9/2014 |
| CN | 104465332 A | 3/2015 |
| CN | 205507361 U | 8/2016 |
| CN | 206115138 U | 4/2017 |
| KR | 20080020205 A | 3/2008 |

\* cited by examiner

DEVELOPING DEVICE AND DEVELOPING METHOD

CROSS REFERENCE

This application claims the priority of Chinese Patent Application No. 201710869745.5, entitled "Developing device and developing method", filed on Sep. 23, 2017, the disclosure of which is incorporated herein by reference in its entirety.

FIELD OF THE INVENTION

The present invention relates to a display panel manufacturing field, and more particularly to a developing device and a developing method.

BACKGROUND OF THE INVENTION

In the display panel manufacturing industry, the substrate fabrication process is an important part of making high quality display panels. The fabrication of the substrate includes processes of cleaning, filming, coating, exposing, developing and etc. The development of the substrate is an important process in the fabrication of the substrate.

Currently, the development of the substrate requires the developing device to develop the exposed substrate. In the developing process, the developing device uses the developer to react with the photoresist on the substrate and remove the same. Then, the developer is recovered. However, during the recovering process of the developer, the photoresist concentration in the developer that reacts with the photoresist on the substrate is too high. The recovery of this portion of the developer to the recovery tank will reduce the concentration of the developer in the recovery box. Then, the user needs to replenish a large amount of developer with a standard concentration into the recovery box for dilution to reduce the photoresist concentration. However, such dilution process will waste a significant material cost.

SUMMARY OF THE INVENTION

An objective of the present invention is to provide a developing device for solving the technical problems of separately recovering the developers doped with different photoresist concentrations during the development of the substrate to reduce the cost of diluting the developer concentration in the recovery box.

The present invention provides a developing device for developing a substrate, comprising: a developing tank, a recovery box and a conveying unit provided right above the developing tank and configured to convey the substrate; wherein the developing tank comprises a first tank, a second tank and a third tank, which are spaced and are sequentially arranged; the recovery box comprises a first box and a second box; the first tank is communicated with the first box; as the substrate is arranged in the second tank, the second tank is communicated with the first box; as the substrate is arranged in the third tank, the third tank is communicated with the second box.

The second tank is communicated with the first box with a first channel, a first valve is configured in the first channel; as the substrate is conveyed in the second tank, the first valve is opened.

The third tank is communicated with the second box with a second channel, a second valve is configured in the second channel; as the substrate is conveyed in the third tank, the second valve in the second channel is opened.

The developing device further comprises: a nozzle configured at a top of the first tank and a wind knife at a top of the third tank.

The conveying unit comprises a plurality of conveying rollers; the plurality of the conveying rollers are arranged in parallel and spaced apart to form a transporting plane.

The developing device further comprises a reflective sensor; wherein the reflective sensor comprises an emitting device and a controlling device, the emitting device emits a signal, the controlling device receives the signal and controls opening and closing of the first valve and the second valve.

The first box is configured with a water inlet.

An inner end surface of the first box is configured with an overflow pipe; the overflow pipe communicates with an inside of the first box and an outside of the first box.

The present invention further provides a developing method, comprising steps of:

placing a substrate on a transporting plane and detecting the substrate by a reflective sensor and starting timing;

activating a conveying unit to convey the substrate above a first tank and spraying the substrate with a nozzle;

conveying the substrate above a second tank after a first spraying duration and opening a first valve and closing a second valve by the reflective sensor to communicate the second tank with a first box;

conveying the substrate above a third tank after a conveying duration and closing the first valve and opening the second valve by the reflective sensor to communicate the third tank with a second box.

The benefits of the present invention are: by configuring the first valve in the first channel and the second valve in the second channel, the reflective sensor is used to control the opening and closing of the two valves. As the substrate is in the first tank, the reflective sensor opens the first valve and closes the second valve to communicate the second tank with the first box, and the first box recoveries the developer with a low photoresist concentration in the second tank; as the substrate is in the second tank, the reflective sensor closes the first valve and opens the second valve to communicate the third tank with the second box, and the second box recoveries the developer with a high photoresist concentration in the third tank. Therefore, in the development of the substrate, the developing device can recover the developers doped with different photoresist concentrations separately to reduce the cost of diluting the developer in the recovery box.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
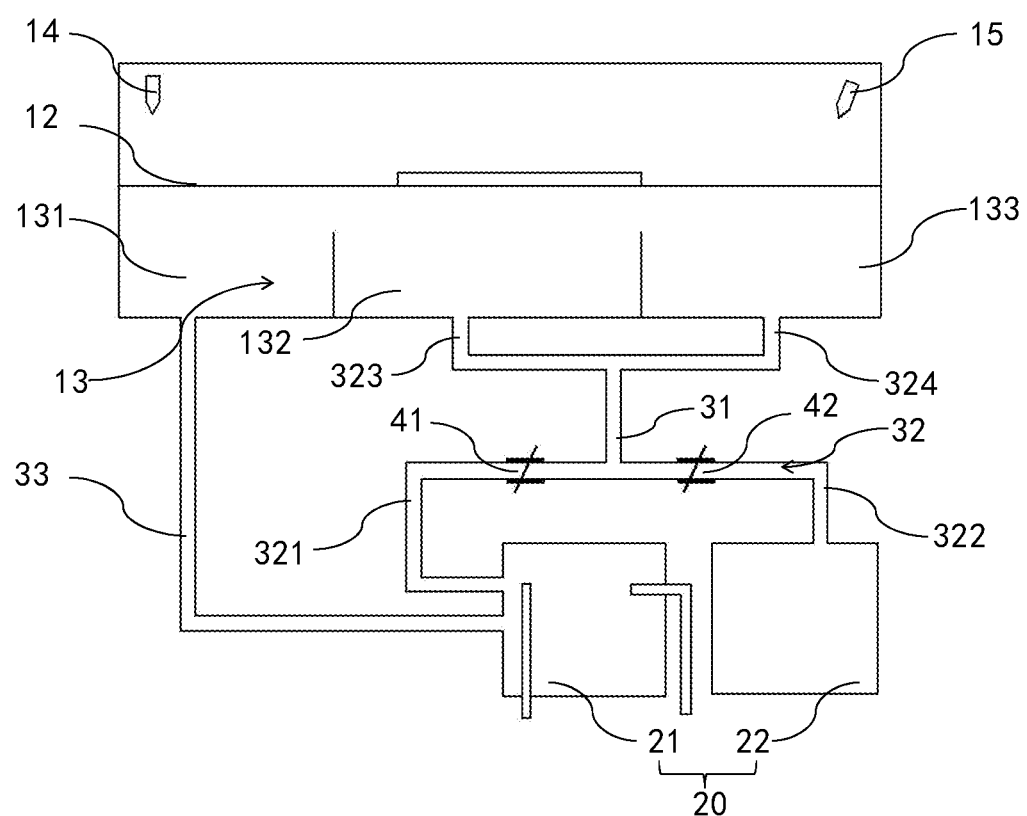
FIG. 1 is a structure diagram of a developing device according to the embodiment of the present invention.

Please refer to FIG. 1. The embodiment of the present invention provides a developing device for developing a substrate, comprising: a developing tank 13, a recovery box 20 and a conveying unit 12 provided right above the developing tank 13 and configured to convey the substrate. The exposed substrate is arranged in the conveying unit 12 to be conveyed in the developing tank 13. In the developing device, the developer reacts with the photoresist on the substrate. Then, the photoresist on the substrate can be removed. The developing tank 13 is used to contain the developer and to discharge the developer. The recovery box 20 is used to recover the developer discharged from the developing tank 13 in the developing device. The recovered developer can be reused to avoid waste of developer.

Specifically, during the recovery of the developer, the developer reacts with the photoresist on the substrate such that the photoresist concentration of the developer increases. Then, the developer with a high photoresist concentration needs to be separately recovered. The developing tank 13 comprises a first tank 131, a second tank 132 and a third tank 133, which are spaced and are sequentially arranged. The first tank 131 is used to collect the developer which does not react. The second tank 132 is used to collect the developer flowing out from the surface of the substrate. The third tank 133 is used to collect developer that has reacted with the photoresist on the surface of the substrate. Besides, a first partition is configured between the first tank 131 and the second tank 132. A second partition is configured between the second tank 132 and the third tank 133. The first partition is used to prevent the first tank 131 and the second tank 132 from communicating with each other. The second partition is used to prevent the second tank 132 and the third tank 133 from communicating with each other. Thus, the developing device can achieve recovering the developers doped with different photoresist concentrations separately to reduce the cost of diluting the developer concentration.

AS shown in FIG. 1, the developing device further comprises: a nozzle 14 and a wind knife 15. The nozzle 14 is configured at a top of the first tank 131. The nozzle 14 is used to supply the developer. As the substrate is conveyed by the conveying unit 12 to a position corresponding to the nozzle 14, the nozzle 14 sprays the developer for reacting with the photoresist on the substrate. The wind knife 15 is configured at a top of the third tank 133. As the substrate is conveyed to a position corresponding to the wind knife 15, the wind knife 15 blows the developer on the substrate into the third tank 133. The developer is discharged out of the developing tank 13 through the third tank 133.

Figure 2:
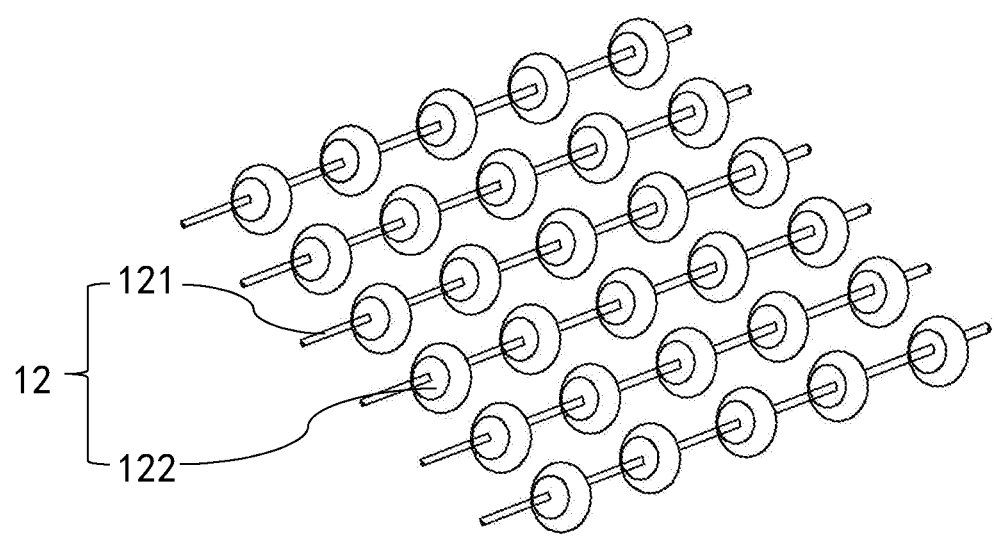
FIG. 2 is a structure diagram of a conveying unit in FIG. 1.

As shown in FIG. 2, in this embodiment, the conveying unit 12 comprises a plurality of conveying rollers 121 and a plurality of flexible rings 122 configured on the conveying rollers 121. The flexible rings 122 are made of a rubber material. The plurality of the conveying rollers are arranged in parallel and spaced apart to form a transporting plane. The substrate is arranged in the transporting plane. The rotation of the flexible rings 122 is driven by the rotation of the conveying rollers 121 so that the substrate can be moved to have a movement relative to the conveying rollers 121. The flexible rings 122 also avoid scraping of the substrate and the conveying rollers 121 during the rotation. The rotation of the conveying roller 121 is driven by a driving device that is an electric motor. In other embodiments, the conveying unit can comprise a plurality of conveying rollers and a conveying belt configured on the plurality of conveying rollers. The conveying rollers are driven by a driving part to rotate. The rotation of the conveying rollers drives the movement of the conveying belt. The conveying unit can comprise a plurality of conveying rollers and a plurality of robot hands configured on the plurality of conveying rollers. The robot hands are used to extract the substrate to move the substrate.

As shown in FIG. 1, the recovery box 20 comprises a first box 21 and a second box 22. The first box 21 is used to recover the developer with a low photoresist concentration and to achieve reuse. The second box 22 is used to recover the developer with a high photoresist concentration. The first box 21 is configured with a water inlet. As the first box 21 is doped with photoresist, the water inlet is required to import the developer to dilute the photoresist concentration in the first tank 21 such that the developer doped with the photoresist can have a concentration which is suitable for reacting with the photoresist. Besides, an inner end surface of the first box 21 is configured with an overflow pipe. The overflow pipe communicates with an inside of the first box 21 and an outside of the first box 21. When the developer recovered in the first box 21 is diluted by recovering the developer or injecting the standard developer, and the height of the developer stored in the first box 21 reaches the height of the overflow pipe inside the first box 21, the developer in the first box 21 flows out of the first box 21 through the overflow pipe.

In this embodiment, as shown in FIG. 1, the developing tank 13 and the recovery box 20 communicate with each other through the channels. The first tank 131 and the first box 21 are constantly in communication with each other through the third channel 33. The second tank 132 is communicated with the first box 21 with the first channel. The third tank 133 is communicated with the second box 22 with the second channel. The first channel and the second channel comprise a main channel 31. Specifically, the main channel 31 comprises sub channels 32, which are respectively connected with two ends of the main channel 31. The main channel 31 is a common channel through which the developer in the second tank 132 flows and the developer in the third tank 133 flows. The sub channel 32 connected to one end of the main channel 31 comprises a first sub channel 321 and a second sub channel 322 connected with one end of the first sub channel 321; the sub channel 32 connected to the other end of the main channel 31 comprises a third sub channel 323 and a fourth sub channel 324; the other end of the first sub channel 321 is communicated with the first box 21; the other end of the second sub channel 322 is communicated with the second box 22; the other end of the third sub channel 323 is communicated with the second tank 132; the other end of the fourth sub channel 324 is communicated with the third tank 133. Then, two valves are configured in the channels of the developing device. One valve is used to control the recovery of the developer, which does not completely react with the photoresist and the other valve is used to control the recovery of the developer, which completely reacts with the photoresist. Specifically, a first valve 41 is configured in the first sub channel 321 and a second valve 42 is configured in the second sub channel 322. The first valve 41 and the second valve 42 respectively control the flowing paths of the developer in the first sub channel 321 and the second sub channel 322.

In other embodiments, the first tank 131 and the first box 21 are constantly in communication with each other through the third channel 33. The second tank 132 is directly communicated with the first box 21 with the first channel. The third tank 133 is directly communicated with the second box 22 with the second channel. As the substrate is in the first tank 131, the developer directly flows into the first box 21 through the first tank 131. As the substrate is in the second tank 132, the developer does not react with the photoresist on the surface of the substrate but directly flows into the first box 21 through the second tank 132. As the substrate is in the third tank 133, the developer on the surface of the substrate reacts completely with the photoresist on the substrate. The developer doped with photoresist with a high concentration directly flows into the second box 22 through the third tank 133. The developers on the substrate in different positions are recovered through the first tank 131, the second tank 132 and the third tank 133. Thus, the developing device can recover the developers doped with different photoresist concentrations separately.

As shown in FIG. 1, the developing device further comprises a reflective sensor 16. During the conveying process of the conveying unit 12, the substrate sequentially passes through the first tank 131, the second tank 132 and the third tank 133. The reflective sensor 16 is used to confirm the position of the substrate and to control the opening and closing of the first valve 41 and the second valve 42. Specifically, the reflective sensor 16 comprises an emitting device 161 and a controlling device 162. The reflective sensor 16 is installed at the top of the developing device. The reflective sensor comprises a reflective photoelectric sensor but is not limited thereto. The substrate is placed in a position of the transporting plane corresponding to the nozzle 14. The nozzle 14 starts spraying the substrate. A portion of the sprayed developer stays on the surface of the substrate and a portion of the developer flows into the first box 21 through the third channel 33. Meanwhile, the reflective sensor 16 emits a signal via the emitting device 161. The signal is reflected by the substrate. The controlling device receives the signal reflected by the substrate. After the controlling device 162 analyzes and processes the signal, the existence of the substrate on the transporting surface can be confirmed. The controlling device 162 starts timing. After a spraying duration of the nozzle 14, the substrate is in the second tank 132. The controlling device 162 opens the first valve 41 and closes the second valve 42. The second tank 132 is communicated with the first box 21. Since the movement of the substrate, a portion of the developer on the surface of the substrate is adhered on the surface of the substrate and a portion of the developer on the surface of the substrate flows into the second tank 132. After conveying in a duration, the substrate is in the third tank. The controlling device 162 closes the first valve 41 and opens the second valve 42. The third tank 133 is communicated with the second box 22. Then, the developer on the surface of the substrate reacts completely with the photoresist of the substrate. With the blowing of the wind knife 15, the developer on the surface is blew into the third tank 133 and flows into the second box 22 through the second channel. Therefore, the developing device can control the opening and closing of the valves with the reflective sensor 16 so that the developers on the substrate in different positions can be recovered separately.

Figure 3:
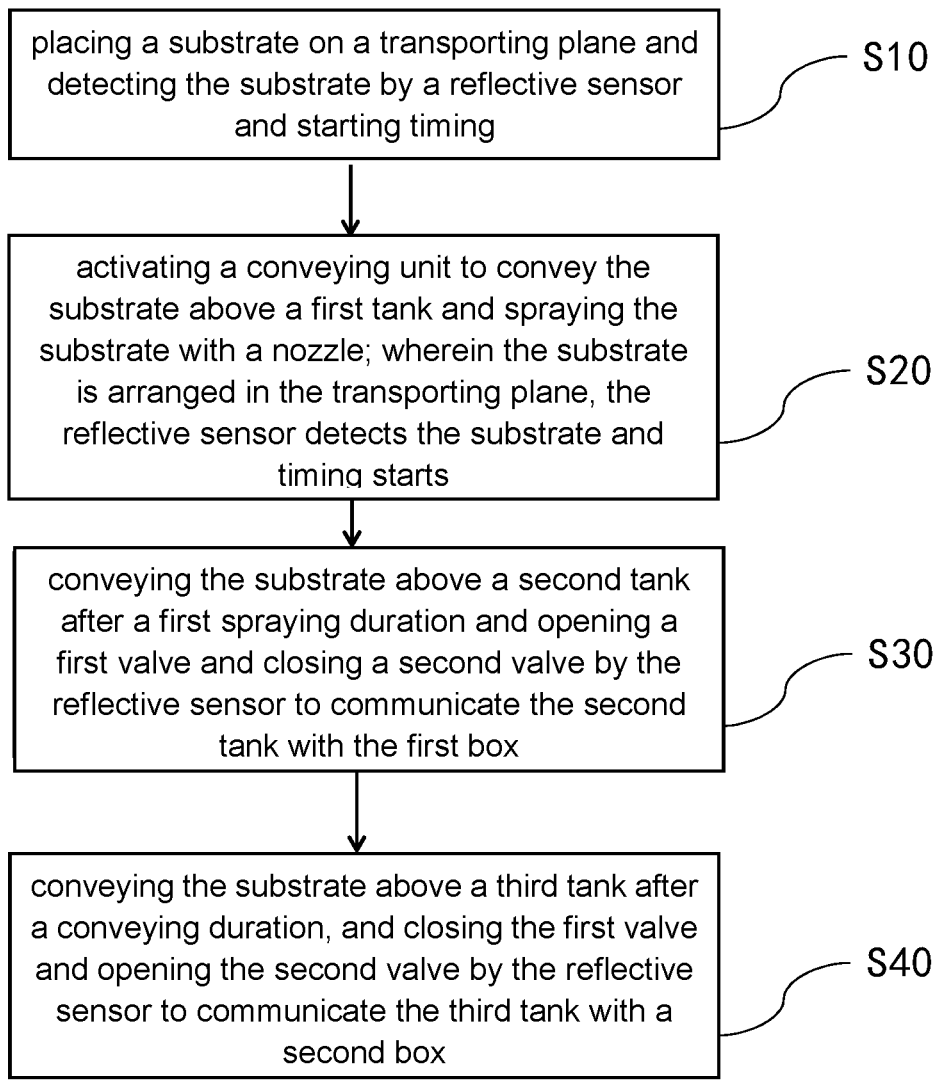
FIG. 3 is a flowchart of a developing method according to the embodiment of the present invention.

As shown in FIG. 3, the present invention further provides a developing method, comprising steps of:

Step S10, placing a substrate on a transporting plane and detecting the substrate by a reflective sensor and starting timing; wherein the substrate is placed in a position of the transporting plane corresponding to the nozzle 14. The reflective sensor 16 emits a signal via the emitting device 161. The signal is reflected by the substrate. The controlling device receives the signal reflected by the substrate. After the controlling device 162 analyzes and processes the signal, the existence of the substrate on the transporting surface can be confirmed. The controlling device 162 starts timing.

Step S20, activating a conveying unit to convey the substrate above a first tank and spraying the substrate with a nozzle; wherein the nozzle 14 starts spraying the substrate, a portion of the sprayed developer stays on the surface of the substrate and a portion of the developer flows into the first box 21 through the third channel 33.

Step S30, conveying the substrate above a second tank after a first spraying duration and opening a first valve and closing a second valve by the reflective sensor to communicate the second tank with the first box; wherein the developer stays on the surface of the substrate sprayed by the nozzle 14, since the substrate moves with being driven by the conveying unit 12, a portion of the developer is adhered on the surface of the substrate and a portion of the developer flows into the first box 21 through the first channel.

Step S40, conveying the substrate above a third tank after a conveying duration and closing the first valve and opening the second valve by the reflective sensor to communicate the third tank with a second box. Then, the developer on the surface of the substrate reacts completely with the photoresist of the substrate. With the blowing of the wind knife 15, the developer on the surface of the substrate is blew into the third tank 133 by the wind knife 15 and flows into the second box 22 through the second channel.

In the embodiment of the present invention, by configuring the first valve 41 in the first channel 321 and the second valve 42 in the second channel 322 in the developing device, the reflective sensor 16 is used to open the first valve 41 and to close the second valve 42 for communicating the second tank 132 with the first box 21, and to close the first valve 41 and to open the second valve 42 for communicating the third tank 133 with the second box 22. Thus, the developing device can achieve recovering the developers doped with different photoresist concentrations separately to reduce the cost of diluting the developer concentration in the recovery box.

Above are embodiments of the present invention, which does not limit the scope of the present invention. Any modifications, equivalent replacements or improvements within the spirit and principles of the embodiment described above should be covered by the protected scope of the invention.

What is claimed is:

1. A developing device for developing a substrate, comprising: a developing tank, a recovery box and a conveying unit provided above the developing tank and configured to convey the substrate; wherein the developing tank comprises a first tank, a second tank and a third tank, which are spaced and are sequentially arranged; the recovery box comprises a first box and a second box; and the first tank is connected to and in communication with the first box;

wherein the conveying unit comprises at least a movable member that is operable to convey the substrate sequentially through the first, second, and third tanks, wherein a developer is supplied onto the substrate in the first tank such that a first portion of the developer remains on the substrate and a second portion of the developer is collected in the first tank and flows to the first box; a part of the first portion of the developer drops into the second tank, as the substrate is conveyed into the second tank, the second tank being connected to and in communication with the first box so that the part of the first portion of the developer that drops into the second tank flows into the first box; and a remaining part of the first portion of the developer that is left on the substrate drops into the third tank, as the substrate is conveyed into the third tank, the third tank being connected to and in communication with the second box so that the remaining part of the first portion of the developer that drops into the third tank flows into the second box.

2. The developing device according to claim 1, wherein the second tank is communicated with the first box with a first channel, a first valve is configured in the first channel; as the substrate is conveyed in the second tank, the first valve is opened.

3. The developing device according to claim 1, wherein the third tank is communicated with the second box with a second channel, a second valve is configured in the second channel; as the substrate is conveyed in the third tank, the second valve in the second channel is opened.

4. The developing device according to claim 1, further comprising: a nozzle configured at a top of the first tank and a wind knife at a top of the third tank.

5. The developing device according to claim 1, wherein the conveying unit comprises a plurality of conveying rollers; the plurality of the conveying rollers are arranged in parallel and spaced apart to form a transporting plane.

6. The developing device according to claim 2, further comprising a reflective sensor; wherein the reflective sensor comprises an emitting device and a controlling device, the emitting device emits a signal, the controlling device receives the signal and controls opening and closing of the first valve and the second valve.

7. The developing device according to claim 3, further comprising a reflective sensor; wherein the reflective sensor comprises an emitting device and a controlling device, the emitting device emits a signal, the controlling device receives the signal and controls opening and closing of the first valve and the second valve.

8. The developing device according to claim 1, wherein the first box is configured with a water inlet.

9. The developing device according to claim 8, wherein an inner end surface of the first box is configured with an overflow pipe; the overflow pipe communicates with an inside of the first box and an outside of the first box.

10. The developing device according to claim 5, wherein the conveying unit comprises a plurality of flexible rings configured on the conveying rollers and the flexible rings rotate with the conveying rollers.

* * * * *